(12) United States Patent
Li

(10) Patent No.: US 11,158,717 B1
(45) Date of Patent: Oct. 26, 2021

(54) METHOD FOR MANUFACTURING THIN-FILM TRANSISTOR (TFT) SUBSTRATE AND TFT SUBSTRATE

(71) Applicant: Wuhan China Star Optoelectronics Semiconductor Display Technology Co., LTD., Hubei (CN)

(72) Inventor: Shasha Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 325 days.

(21) Appl. No.: 16/485,441

(22) PCT Filed: Feb. 20, 2019

(86) PCT No.: PCT/CN2019/075528
§ 371 (c)(1),
(2) Date: Aug. 12, 2019

(87) PCT Pub. No.: WO2020/124767
PCT Pub. Date: Jun. 25, 2020

(30) Foreign Application Priority Data

Dec. 18, 2018 (CN) .......................... 201811555725.1

(51) Int. Cl.
*H01L 29/49* (2006.01)
*H01L 27/12* (2006.01)
(Continued)

(52) U.S. Cl.
CPC ........ *H01L 29/4958* (2013.01); *H01L 23/544* (2013.01); *H01L 27/124* (2013.01);
(Continued)

(58) Field of Classification Search
CPC ........... H01L 29/78675; H01L 29/4958; H01L 23/544; H01L 21/02565; H01L 27/1288; H01L 27/124
See application file for complete search history.

(56) References Cited

U.S. PATENT DOCUMENTS

2014/0306221 A1* 10/2014 Yamazaki ........... H01L 29/7869
257/43
2016/0190224 A1* 6/2016 Kim .................... H01L 27/3265
257/40
2018/0358236 A1* 12/2018 Arae ................. H01L 29/66742

\* cited by examiner

*Primary Examiner* — Scott B Geyer
(74) *Attorney, Agent, or Firm* — Benesch, Friedlander, Coplan & Aronoff LLP

(57) ABSTRACT

Provided are a method for manufacturing a thin-film transistor (TFT) substrate and a TFT substrate. The method for manufacturing a TFT substrate is capable of effectively protecting the surface of the inorganic insulating layer in the mark area and the mark peripheral area during performing dry etching on the metal layer by providing a protective layer between the inorganic insulating layer and the metal layer to reduce the surface damage of the inorganic insulating layer during dry etching, thereby effectively improving the recognition rate of the alignment mark by the CCD camera in the subsequent alignment process, improving the alignment detection accuracy, and avoiding subsequent alignment anomalies. In addition, it is not necessary to adjust the dry etching parameters of the metal layer, which indirectly reduces the process constraints of the dry etching process, avoids modification and calibration of the alignment CCD camera, and lowers production costs.

10 Claims, 11 Drawing Sheets

(51) Int. Cl.
*H01L 23/544* (2006.01)
*H01L 29/786* (2006.01)
*H01L 29/66* (2006.01)
*H01L 21/02* (2006.01)

(52) U.S. Cl.
CPC .... *H01L 27/1288* (2013.01); *H01L 29/66757* (2013.01); *H01L 29/78675* (2013.01); *H01L 21/02565* (2013.01)

METHOD FOR MANUFACTURING THIN-FILM TRANSISTOR (TFT) SUBSTRATE AND TFT SUBSTRATE

FIELD OF INVENTION

The present invention generally relates to the display technology and, more particularly, to a method for manufacturing a thin-film transistor (TFT) substrate and a TFT substrate.

BACKGROUND OF INVENTION

In the field of display technology, flat panel display devices such as liquid-crystal displays (LCDs) and active-matrix organic light-emitting diode (AMOLED) displays are widely used in various consumer electronic products such as mobile phones, personal digital assistants (PDAs), digital cameras, desktop computer monitors, and notebook computer monitors due to their advantages such as thin body, high image quality, power saving, no radiation, etc.

The display panel is an important component of the LCD and the OLED display. Taking the display panel of an LCD as an example, the LCD panel is generally composed of a color filter (CF), a thin-film transistor (TFT) substrate, liquid crystal (LC) molecules sandwiched between the color filter and the TFT substrate, and a sealant. More particularly, the TFT array substrate is a main component of the current LCD device and the AMOLED device, and is directly related to the development of the high-performance flat panel display device. The TFT array substrate is configured to provide the display with a driver circuit, and is usually provided with a plurality of gate scan lines and a plurality of data lines. The plurality of gate scan lines and the plurality of data lines define a plurality of pixel units, each of which is provided with a TFT and a pixel electrode. The gate of the TFT is connected to a corresponding gate scan line. When the voltage on the gate scan line reaches a turn-on voltage, the channel between the source and the drain of the TFT is turned on, thereby inputting the data voltage on the data line to the pixel electrode, thereby controlling the display of a corresponding pixel region.

During the manufacture of a display panel, a large number of alignment marks are prepared in the peripheral area of the TFT main board. Taking the OLED display as an example, these marks are mainly used for the alignment of the array exposure machine, evaporation, and the alignment of the packaging equipment. In the alignment process, mark recognition is generally performed by a charge-coupled device (CCD) camera. When the mark pattern or the film thickness is abnormal, mark recognition by the CCD camera is affected, resulting in alignment failure.

The alignment marks on the TFT main board are generally metal alignment marks formed on the gate metal layer (GE) or the source/drain metal layer (SD) by dry etching. Although the dry etching process can ensure the accuracy of the pattern, plasma bombardment during dry etching will also cause unevenness of the inorganic film layer around the marks, which affects the recognition of the marks by the charge-coupled device (CCD) camera in the subsequent process. FIG. 1 is a schematic structural view of a conventional TFT substrate, including a base substrate 1, and an active layer 2, a gate insulating layer 3, a gate metal layer 4, an interlayer dielectric layer (IDL) 5, and a source/drain electrode layer 6, which are stackedly disposed on the base substrate 1 in sequence. More particularly, the gate metal layer 4 includes a metal alignment mark 45 disposed on the periphery of the display area. The dry etching process on the gate metal layer 4 damages the surface of the gate insulating layer 3 and the dry etching process on the source/drain electrode layer 6 damages the surface of the interlayer dielectric layer 5, resulting in uneven surfaces of the gate insulating layer 3 and the interlayer dielectric layer 5 around the metal alignment mark 45 and thereby affecting the recognition of the metal alignment mark 45 by the CCD camera in the subsequent process.

For the above-mentioned mark alignment anomaly, the conventional solution mainly adjusts the dry etching parameters and increases the number of CCD cameras. However, adjusting the dry etching parameters cannot completely avoid the damages on the surface of the inorganic film layers around the mark and can only reduce the impact to a certain extent. Other aspects of the impact, such as critical dimension (CD) unevenness and so on, brought about by the adjustment of process parameters need to be taken into account. In addition, although the cooperative operation of multiple CCD cameras can effectively solve the mark alignment abnormality, this solution involves equipment modification and higher cost.

SUMMARY OF INVENTION

One object of the present invention is to provide a method for manufacturing a thin-film transistor (TFT) substrate, which reduces surface damages of an inorganic insulating layer during dry etching on a metal layer and avoid subsequent alignment anomalies.

Another object of the present invention is to provide a TFT substrate, which reduces surface damages of an inorganic insulating layer during dry etching on a metal layer and avoid subsequent alignment anomalies.

In order to achieve the foregoing objects, the present invention firstly provides a method for manufacturing a thin-film transistor (TFT) substrate, wherein the TFT substrate is divided into a display area and a display peripheral area surrounding the display area, the display peripheral area being divided into a mark area and a mark peripheral area surrounding the mark area;

the method including steps of forming an inorganic insulating layer; forming a protective layer on the inorganic insulating layer; forming a metal layer on the inorganic insulating layer and the protective layer; performing dry etching on the metal layer to acquire a metal pattern; and removing the protective layer uncovered by the metal pattern;

wherein the protective layer is provided to protect a surface of the inorganic insulating layer in the mark area and the mark peripheral area during dry etching on the metal layer.

Preferably, the protective layer includes a transparent conductive protective layer and, in Step of removing the protective layer uncovered by the metal pattern, a transparent conductive pattern having the same pattern as the metal pattern is formed by a remaining portion of the transparent conductive protective layer.

Preferably, the protective layer includes a photoresist protective layer and, prior to the step of forming the metal layer, the photoresist protective layer is formed outside a region where the metal pattern to be formed and, in Step of removing the protective layer uncovered by the metal pattern, the photoresist protective layer is completely removed.

Preferably, the TFT substrate includes a plurality of inorganic insulating layers and a plurality of metal layers, the plurality of inorganic insulating layers includes a gate insulating layer and an interlayer dielectric layer, and the plurality of metal layers includes a gate metal layer and a source/drain metal layer, wherein the metal pattern formed by the gate metal layer includes a gate disposed in the display area and an alignment mark disposed in the mark area, and the protective layer includes a transparent conductive protective layer that protects a surface of the gate insulating layer and a photoresist protective layer that protects a surface of the interlayer dielectric layer, the method specifically including steps of:

Step S1, providing a base substrate, whereon is formed a buffer layer, whereon is deposited and patterned an active layer;

Step S2, sequentially forming the gate insulating layer, the transparent conductive protective layer and the gate metal layer on the buffer layer and the active layer;

Step S3, forming a first photoresist layer on the gate metal layer, performing dry etching on the gate metal layer by using the first photoresist layer as a mask layer to acquire a first metal pattern including the gate and the alignment mark;

Step S4, performing wet etching on the transparent conductive protective layer by using the first photoresist layer and the first metal pattern as a mask layer to remove the transparent conductive protective layer uncovered by the first metal pattern, forming a transparent conductive pattern having the same pattern as the first metal pattern, and removing the first photoresist layer;

Step S5, depositing the interlayer dielectric layer on the first metal pattern and the gate insulating layer, and forming a second photoresist layer on the interlayer dielectric layer by using a half-tone mask, wherein the second photoresist layer includes a first photoresist portion corresponding to the mark area and the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S6, performing an ashing treatment on the second photoresist layer to reduce the thickness of the second photoresist layer until the second photoresist portion is removed, and forming the photoresist protective layer by using the remaining first photoresist portion; and Step S7, forming the source/drain metal layer on the interlayer dielectric layer and the photoresist protective layer, forming a third photoresist layer on the source/drain metal layer, performing dry etching on the source/drain metal layer by using the third photoresist layer as a mask layer to acquire a second metal pattern including a source and a drain, and removing the third photoresist layer and the photoresist protective layer, wherein the source and the drain are connected to the active layer through the via holes.

Preferably, the TFT substrate includes a plurality of inorganic insulating layers and a plurality of metal layers, the plurality of inorganic insulating layers includes a gate insulating layer and an interlayer dielectric layer, and the plurality of metal layers includes a gate metal layer and a source/drain metal layer, wherein the metal pattern formed by the source/drain metal layer includes a source and a drain disposed in the display area and an alignment mark disposed in the mark area, and the protective layer includes a transparent conductive protective layer that protects a surface of the gate insulating layer and a photoresist protective layer that protects a surface of the interlayer dielectric layer, the method specifically including steps of:

Step S1', providing a base substrate, whereon is formed a buffer layer, whereon is deposited and patterned an active layer;

Step S2', sequentially forming the gate insulating layer, the transparent conductive protective layer and the gate metal layer on the buffer layer and the active layer;

Step S3', forming a first photoresist layer on the gate metal layer, performing dry etching on the gate metal layer by using the first photoresist layer as a mask layer to acquire a first metal pattern including the gate;

Step S4', performing wet etching on the transparent conductive protective layer by using the first photoresist layer and the first metal pattern as a mask layer to remove the transparent conductive protective layer uncovered by the first metal pattern, forming a transparent conductive pattern having the same pattern as the first metal pattern, and removing the first photoresist layer;

Step S5', depositing the interlayer dielectric layer on the first metal pattern and the gate insulating layer, and forming a second photoresist layer on the interlayer dielectric layer by using a half-tone mask, wherein the second photoresist layer includes a first photoresist portion corresponding to the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S6', performing an ashing treatment on the second photoresist layer to reduce the thickness of the second photoresist layer until the second photoresist portion is removed, and forming the photoresist protective layer by using the remaining first photoresist portion;

Step S7', forming the source/drain metal layer on the interlayer dielectric layer and the photoresist protective layer, forming a third photoresist layer on the source/drain metal layer, performing dry etching on the source/drain metal layer by using the third photoresist layer as a mask layer to acquire a second metal pattern including the source and the drain and the alignment mark, and removing the third photoresist layer and the photoresist protective layer, wherein the source and the drain are connected to the active layer through the via holes.

Preferably, the TFT substrate includes a plurality of inorganic insulating layers and a plurality of metal layers, the plurality of inorganic insulating layers includes a gate insulating layer and an interlayer dielectric layer, and the plurality of metal layers includes a gate metal layer and a source/drain metal layer, wherein the metal pattern formed by the gate metal layer includes a gate disposed in the display area and an alignment mark disposed in the mark area, and the protective layer includes a first photoresist protective layer that protects a surface of the gate insulating layer and a second photoresist protective layer that protects a surface of the interlayer dielectric layer, the method specifically including steps of:

Step S10, providing a base substrate, whereon is formed a buffer layer, whereon is deposited and patterned an active layer;

Step S20, depositing the gate insulating layer on the buffer layer and the active layer, forming on the gate insulating layer the first photoresist protective layer corresponding to the mark peripheral area, and forming the gate metal layer on the gate insulating layer and the first photoresist protective layer;

Step S30, forming a first photoresist layer on the gate metal layer, performing dry etching on the gate metal layer by using the first photoresist layer as a mask layer, to acquire a first metal pattern including the gate and the alignment mark;

Step S40, removing the first photoresist layer and the first photoresist protective layer;

Step S50, depositing the interlayer dielectric layer on the first metal pattern and the gate insulating layer, and forming a second photoresist layer on the interlayer dielectric layer by using a half-tone mask, wherein the second photoresist layer includes a first photoresist portion corresponding to the mark area and the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S60, performing an ashing treatment on the second photoresist layer to reduce the thickness of the second photoresist layer until the second photoresist portion is removed, and forming the second photoresist protective layer by using the remaining first photoresist portion; and Step S70, forming the source/drain metal layer on the interlayer dielectric layer and the second photoresist protective layer, forming a third photoresist layer on the source/drain metal layer, performing dry etching on the source/drain metal layer by using the third photoresist layer as a mask layer to acquire a second metal pattern including a source and a drain, and removing the third photoresist layer and the second photoresist protective layer, wherein the source and the drain are connected to the active layer through the via holes.

Preferably, the TFT substrate includes a plurality of inorganic insulating layers and a plurality of metal layers, the plurality of inorganic insulating layers includes a gate insulating layer and an interlayer dielectric layer, and the plurality of metal layers includes a gate metal layer and a source/drain metal layer, wherein the metal pattern formed by the source/drain metal layer includes a source and a drain disposed in the display area and an alignment mark disposed in the mark area, and the protective layer includes a first photoresist protective layer that protects a surface of the gate insulating layer and a second photoresist protective layer that protects a surface of the interlayer dielectric layer, the method specifically including steps of:

Step S10', providing a base substrate, whereon is formed a buffer layer, whereon is deposited and patterned an active layer;

Step S20', depositing the gate insulating layer on the buffer layer and the active layer, forming on the gate insulating layer the first photoresist protective layer corresponding to the mark peripheral area, and forming the gate metal layer on the gate insulating layer and the first photoresist protective layer;

Step S30', forming a first photoresist layer on the gate metal layer, performing dry etching on the gate metal layer by using the first photoresist layer as a mask layer, to acquire a first metal pattern including the gate and the alignment mark;

Step S40', removing the first photoresist layer and the first photoresist protective layer;

Step S50', depositing the interlayer dielectric layer on the first metal pattern and the gate insulating layer, and forming a second photoresist layer on the interlayer dielectric layer by using a half-tone mask, wherein the second photoresist layer includes a first photoresist portion corresponding to the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S60', performing an ashing treatment on the second photoresist layer to reduce the thickness of the second photoresist layer until the second photoresist portion is removed, and forming the second photoresist protective layer by using the remaining first photoresist portion; and Step S70', forming the source/drain metal layer on the interlayer dielectric layer and the second photoresist protective layer, forming a third photoresist layer on the source/drain metal layer, performing dry etching on the source/drain metal layer by using the third photoresist layer as a mask layer to acquire a second metal pattern including the source and the drain and the alignment mark, and removing the third photoresist layer and the second photoresist protective layer, wherein the source and the drain are connected to the active layer through the via holes.

The present invention further provides a thin-film transistor (TFT) substrate, which is divided into a display area and a display peripheral area surrounding the display area, the display peripheral area being divided into a mark area and a mark peripheral area surrounding the mark area, the TFT substrate including an inorganic insulating layer, a metal layer and a transparent conductive protective layer correspondingly disposed between the inorganic insulating layer and the metal layer;

wherein the metal layer includes a metal pattern, the transparent conductive protective layer is correspondingly disposed below the metal layer corresponding thereto and includes a transparent conductive pattern having the same pattern as the metal layer, and the transparent conductive protective layer is provided to protect a surface of the inorganic insulating layer in the mark area and the mark peripheral area during dry etching on the metal layer to form the metal pattern.

Preferably, the TFT substrate includes a plurality of inorganic insulating layers and a plurality of metal layers, wherein the plurality of inorganic insulating layers includes a gate insulating layer and an interlayer dielectric layer, the plurality of metal layers includes a gate metal layer disposed on the gate insulating layer and a source/drain metal layer disposed on the interlayer dielectric layer, and the transparent conductive protective layer is correspondingly disposed between the gate insulating layer and gate metal layer, wherein, the TFT substrate specifically includes a base substrate, a buffer layer disposed on the base substrate, an active layer disposed on the buffer layer, a gate insulating layer disposed on the buffer layer and the active layer, a transparent conductive protective layer disposed on the gate insulating layer, a gate metal layer disposed on the transparent conductive protective layer, an interlayer dielectric layer disposed on the gate metal layer and gate insulating layer, and a source/drain metal layer disposed on the interlayer dielectric layer;

the gate metal layer includes a first metal pattern including a gate;

the transparent conductive protective layer is correspondingly disposed below the gate metal layer and includes a transparent conductive pattern having the same pattern as the first metal layer; and the source/drain metal layer includes a second metal pattern including a source and a drain.

Preferably, one of the first metal pattern and the second metal pattern further includes an alignment mark correspondingly disposed in the mark area.

Beneficial effects of the present invention—the method for manufacturing a TFT substrate according to the present invention is capable of effectively protecting the surface of the inorganic insulating layer in the mark area and the mark peripheral area during dry etching on the metal layer by providing a protective layer between the inorganic insulating layer and the metal layer to reduce the surface damage of the inorganic insulating layer during dry etching, thereby effectively improving the recognition rate of the alignment mark by the CCD camera in the subsequent alignment process, improving the alignment detection accuracy, and avoiding subsequent alignment anomalies. In addition, it is not necessary to adjust the dry etching parameters of the metal layer, which indirectly reduces the process constraints of the dry etching process, avoids modification and calibration of the alignment CCD camera, and lowers production costs. In the TFT substrate of the present invention, a transparent conductive protective layer is disposed between the metal layer and the inorganic insulating layer, and the transparent conductive protective layer is correspondingly disposed below the metal layer corresponding thereto and has a transparent conductive pattern having the same pattern as the metal layer. The transparent conductive protective layer may be used to protect the surface of the inorganic insulating layer in the mark area and the mark peripheral area during dry etching on the metal layer to form the metal pattern, so as to reduce the surface damage of the inorganic insulating layer during dry etching on the metal layer to avoid subsequent alignment anomalies.

For a better understanding of the features and the technical content of the present invention, please refer to the following detailed description and drawings of the present invention. However, the drawings are for reference and description only, and are not intended to limit the present invention.

DESCRIPTION OF DRAWINGS

The technical solutions and other beneficial effects of the present invention will be apparently seen from the detailed description of specific embodiments of the present invention with reference to the accompanying drawings, wherein.

DETAILED DESCRIPTION OF PREFERRED EMBODIMENTS

In order to further clarify the technical means adopted by the present invention and its effects, the following is a detailed description in conjunction with preferred embodiments of the present invention and the accompanying drawings.

The present invention provides a method for manufacturing a TFT substrate. The TFT substrate is divided into a display area and a display peripheral area surrounding the display area, and the display peripheral area defines a mark area and a mark peripheral area surrounding the mark area. The mark area is where an alignment mark is formed. By providing a protective layer between the inorganic insulating layer and the metal layer, the surface of the inorganic insulating layer in the mark area and the mark peripheral area can be effectively protected during dry etching on the metal layer so as reduce the surface damage of the inorganic insulating layer during dry etching.

Figure 1:
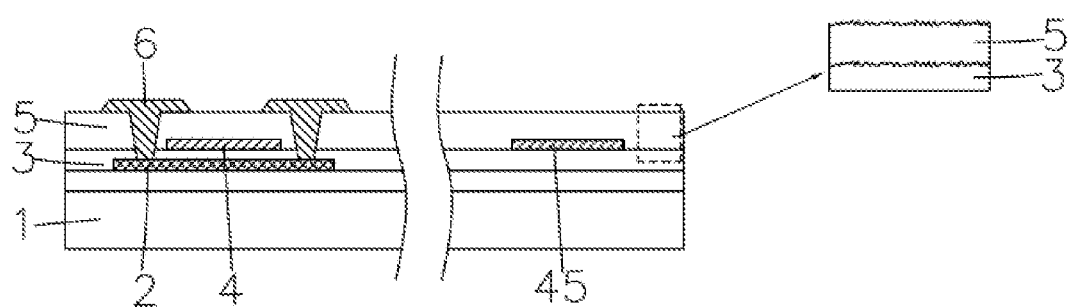
FIG. 1 shows a schematic structural view of a conventional TFT substrate and a partially enlarged schematic view of an inorganic film layer around an alignment mark.
Figure 2:
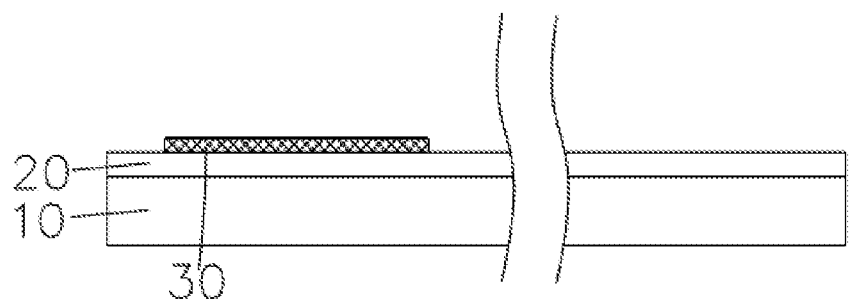
FIG. 2 is a schematic view showing Step S1 in a method for manufacturing a TFT substrate according to a first embodiment of the present invention.

In the method for manufacturing a TFT substrate according to a first embodiment of the present invention, the alignment mark is disposed on the gate metal layer, and the protective layer includes a transparent conductive protective layer that protects a surface of the gate insulating layer and a photoresist protective layer that protects a surface of the interlayer dielectric layer. The method specifically includes the following steps:

In Step S1, as shown in FIG. 2, provided is a base substrate 10, whereon is formed a buffer layer 20, whereon is deposited and patterned an active layer 30.

Specifically, the active layer 30 may be a low-temperature polysilicon (LTPS) active layer.

In Step S2, a gate insulating layer 40, a transparent conductive protective layer 58, and a gate metal layer 50 are sequentially deposited on the buffer layer 20 and the active layer 30.

Specifically, the material of the transparent conductive protective layer 58 is indium-tin oxide (ITO).

Figure 3:
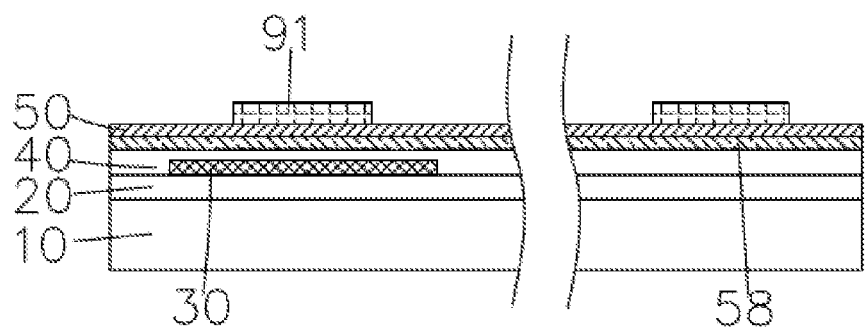
FIG. 3 to FIG. 4 are schematic views showing Step S3 in a method for manufacturing a TFT substrate according to a first embodiment of the present invention.
Figure 4:
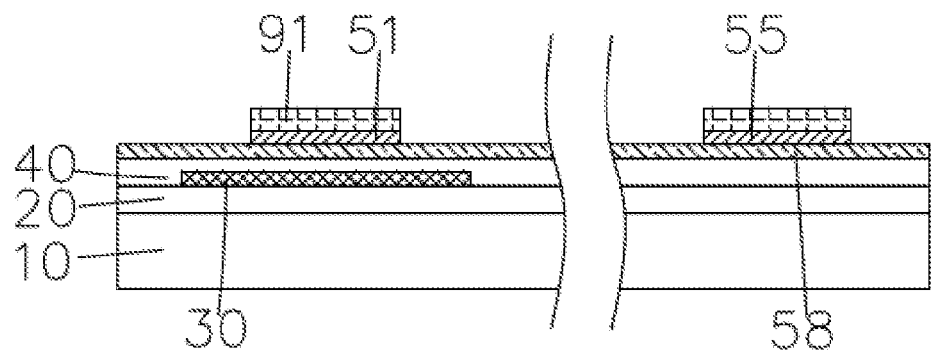

In Step S3, as shown in FIG. 3 to FIG. 4, a first photoresist layer 91 is formed on the gate metal layer 50, and dry etching is performed on the gate metal layer 50 by using the first photoresist layer 91 as a mask layer to acquire a first metal pattern including a gate 51 and an alignment mark.

Specifically, compared with the prior art technology, in Step S3, by adding a transparent conductive protective layer 58 below the gate metal layer 50, the surface of the gate insulating layer 40 can be effectively protected from being damaged during dry etching on the gate metal layer 50.

Figure 5:
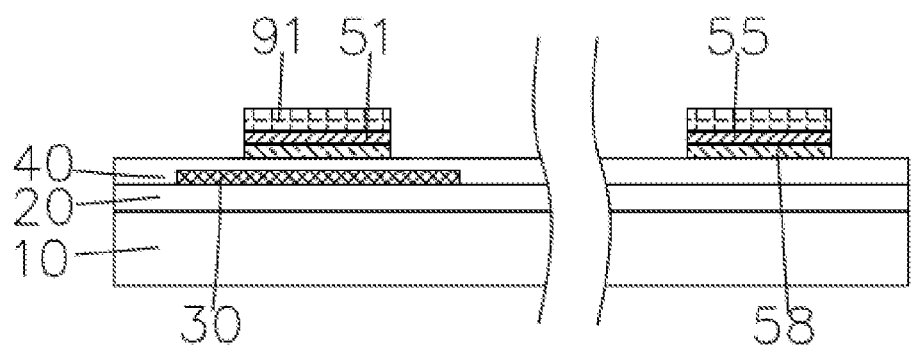
FIG. 5 is a schematic view showing Step S4 in a method for manufacturing a TFT substrate according to a first embodiment of the present invention.

In Step S4, as shown in FIG. 5, wet etching is performed on the transparent conductive protective layer 58 by using the first photoresist layer 91 and the first metal pattern as a mask layer to remove the transparent conductive protective layer 58 uncovered by the first metal pattern. A transparent conductive pattern having the same pattern as the first metal pattern is formed, and then the first photoresist layer 91 is removed.

Specifically, in Step S4, after dry etching on the gate metal layer 50 is completed, the transparent conductive protective layer 58 uncovered by the first metal pattern on the gate insulating layer 40 is removed by wet etching. Since wet etching is chemical etching that exhibits better etching selectivity, the gate insulating layer 40 is not damaged during the removal of the transparent conductive protective layer 58.

Figure 6:
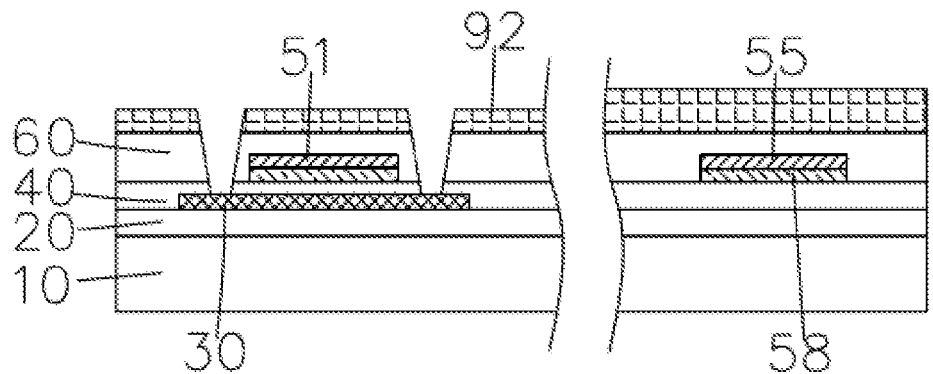
FIG. 6 is a schematic view showing Step S5 in a method for manufacturing a TFT substrate according to a first embodiment of the present invention.

In Step S5, as shown in FIG. 6, an interlayer dielectric layer 60 is deposited on the first metal pattern and the gate insulating layer 40, and a second photoresist layer 92 is formed on the interlayer dielectric layer 60 by using a half-tone mask (HTM). The second photoresist layer 92 includes a first photoresist portion corresponding to the mark area and the mark peripheral area and a remaining second photoresist portion. The first photoresist portion has a thickness larger than a thickness of the second photoresist portion, such that the second photoresist layer 92 is used as a mask layer. Via holes corresponding to an upper end of the active layer 30 are defined in the interlayer dielectric layer 60 and the gate insulating layer 40.

Figure 7:
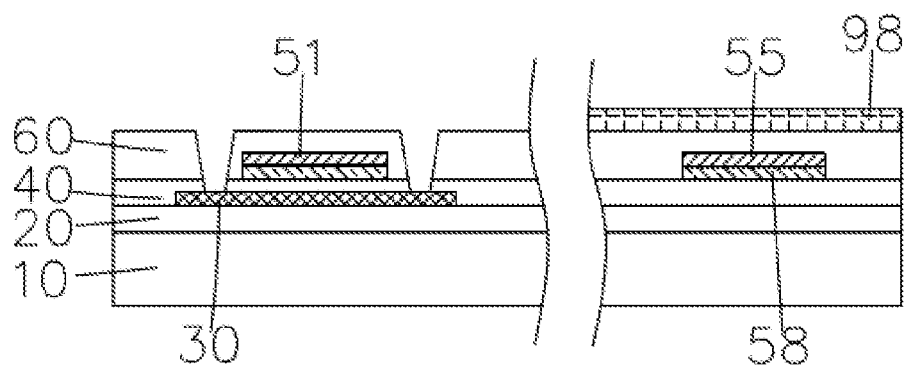
FIG. 7 is a schematic view showing Step S6 in a method for manufacturing a TFT substrate according to a first embodiment of the present invention.

In Step S6, as shown in FIG. 7, an ashing treatment is performed on the second photoresist layer 92 to reduce the thickness of the second photoresist layer 92 until the second photoresist portion is removed, and a photoresist protective layer 98 is formed by using the remaining first photoresist portion.

Figure 8:
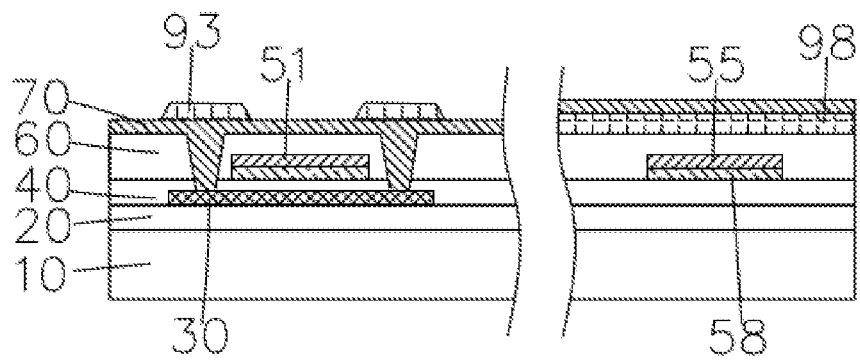
FIG. 8 to FIG. 10 are schematic views showing Step S7 in a method for manufacturing a TFT substrate according to a first embodiment of the present invention and FIG. 10 is a schematic structural view of a TFT substrate according to a fifth embodiment of the present invention.
Figure 9:
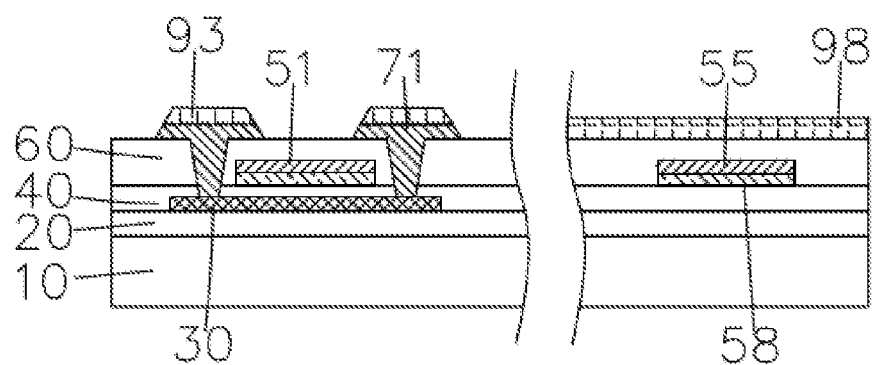
Figure 10:
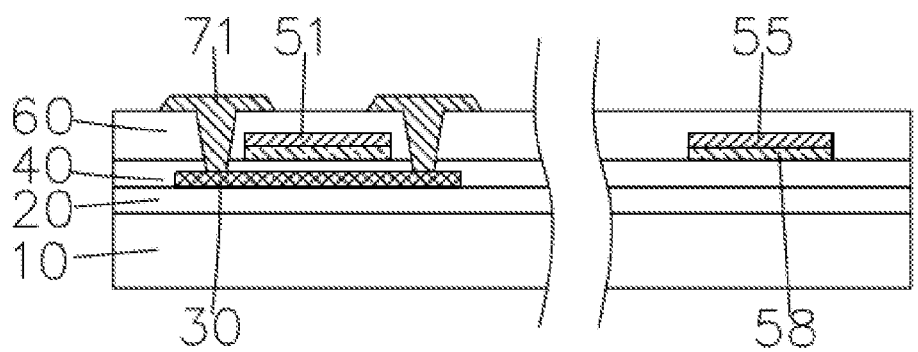

Step S7, as shown in FIG. 8 to FIG. 10, a source/drain metal layer 70 is formed on the interlayer dielectric layer 60 and the photoresist protective layer 98, a third photoresist layer 93 is formed on the source/drain metal layer 70, dry etching is performed on the source/drain metal layer 70 by using the third photoresist layer 93 as a mask layer to acquire a second metal pattern including a source and a drain 71, and the third photoresist layer 93 and the photoresist protective layer 98 are removed. The source and the drain 71 are connected to the active layer 30 through the via holes.

Specifically, in Step S7, the surface of the interlayer dielectric layer 60 in the mark area and the mark peripheral area is protected by the photoresist protective layer 98 from being damaged during dry etching on the source/drain metal layer 70.

In the method for manufacturing a TFT substrate according to the first embodiment of the present invention, compared with the prior art technology, by adding a transparent conductive protective layer 58 below the gate metal layer 50, the surface of the gate insulating layer 40 can be effectively protected from being damaged during dry etching on the gate metal layer 50. After dry etching on the gate metal layer 50 is completed, the transparent conductive protective layer 58 on the gate insulating layer 40 is removed by wet etching. Since wet etching exhibits better etching selectivity, the gate insulating layer 40 is not damaged during the removal of the transparent conductive protective layer 58. The second photoresist layer 92 for forming via holes is formed on the interlayer dielectric layer 60 by using a half-tone mask (HTM), such that the thickness of the second photoresist layer 92 corresponding to the first photoresist portion in the mark area and the mark peripheral area is larger than the thickness of the remaining second photoresist portion. After the via holes are formed, only the second photoresist portion of the second photoresist layer 92 is removed. The remaining first photoresist portion is used as the photoresist protective layer 98, so that the surface of interlayer dielectric layer 60 in the mark area and the mark peripheral area can be protected during dry etching on the source/drain metal layer 70.

In the method for manufacturing a TFT substrate according to a second embodiment of the present invention, compared with the first embodiment, the alignment mark is disposed on the source/drain metal layer. The method specifically includes the following steps:

In Step S1', provided is a base substrate 10', whereon is formed a buffer layer 20', whereon is deposited and patterned an active layer 30'.

In Step S2', a gate insulating layer 40', a transparent conductive protective layer 58', and a gate metal layer 50' are sequentially deposited on the buffer layer 20' and the active layer 30'.

Specifically, the material of the transparent conductive protective layer 58' is indium-tin oxide (ITO).

Figure 11:
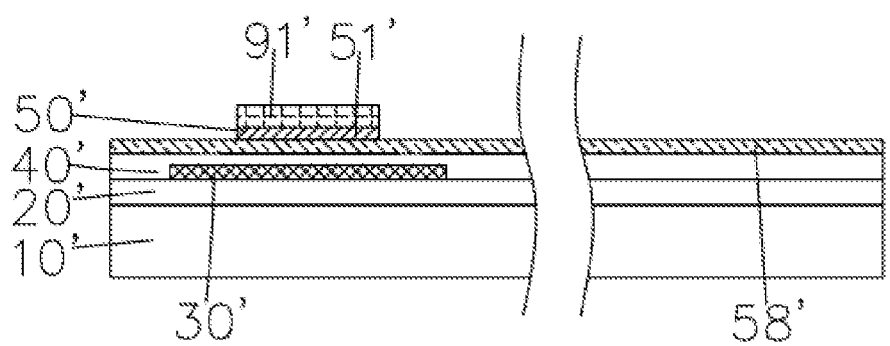
FIG. 11 is a schematic view showing Step S3' in a method for manufacturing a TFT substrate according to a second embodiment of the present invention.

In Step S3', as shown in FIG. 11, a first photoresist layer 91' is formed on the gate metal layer 50', and dry etching is performed on the gate metal layer 50' by using the first photoresist layer 91' as a mask layer to acquire a first metal pattern including a gate 51'.

Figure 12:
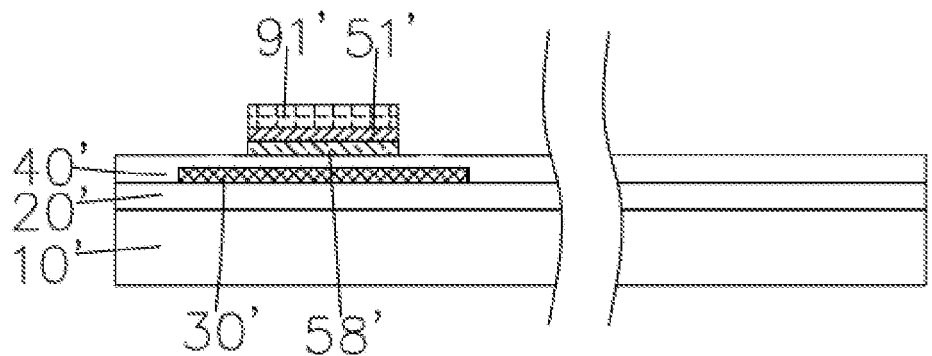
FIG. 12 is a schematic view showing Step S4' in a method for manufacturing a TFT substrate according to a second embodiment of the present invention.

In Step S4', as shown in FIG. 12, wet etching is performed on the transparent conductive protective layer 58' by using the first photoresist layer 91' and the first metal pattern as a mask layer to remove the transparent conductive protective layer 58' uncovered by the first metal pattern. A transparent conductive pattern having the same pattern as the first metal pattern is formed, and then the first photoresist layer 91' is removed.

Figure 13:
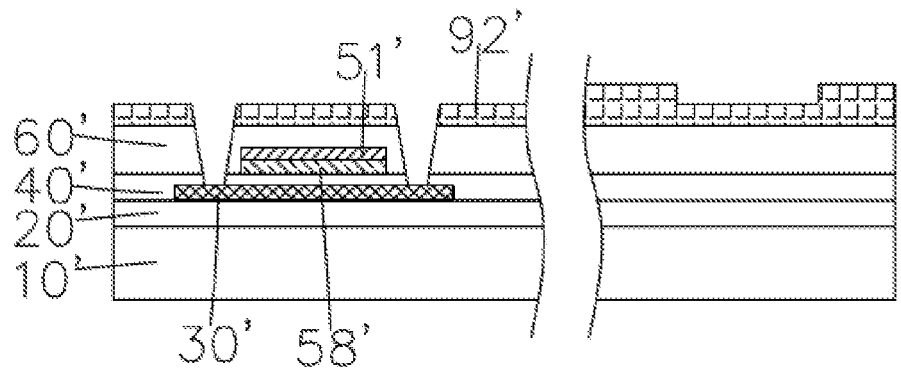
FIG. 13 is a schematic view showing Step S5' in a method for manufacturing a TFT substrate according to a second embodiment of the present invention.

In Step S5', as shown in FIG. 13, an interlayer dielectric layer 60' is deposited on the first metal pattern and the gate insulating layer 40', and a second photoresist layer 92' is formed on the interlayer dielectric layer 60' by using a half-tone mask (HTM). The second photoresist layer 92' includes a first photoresist portion corresponding to the mark peripheral area and a remaining second photoresist portion. The first photoresist portion has a thickness larger than a thickness of the second photoresist portion. The second photoresist portion includes a portion corresponding to the mark area to subsequently form an alignment mark in the mark area. The second photoresist layer 92' is used as a mask layer. Via holes corresponding to an upper end of the active layer 30' are defined in the interlayer dielectric layer 60' and the gate insulating layer 40'.

Figure 14:
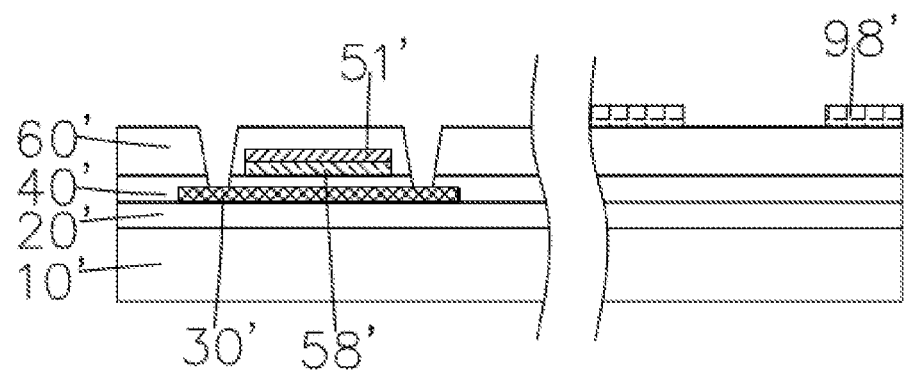
FIG. 14 is a schematic view showing Step S6' in a method for manufacturing a TFT substrate according to a second embodiment of the present invention.

In Step S6', as shown in FIG. 14, an ashing treatment is performed on the second photoresist layer 92' to reduce the thickness of the second photoresist layer 92' until the second photoresist portion is removed, and a photoresist protective layer 98' is formed by using the remaining first photoresist portion.

Figure 15:
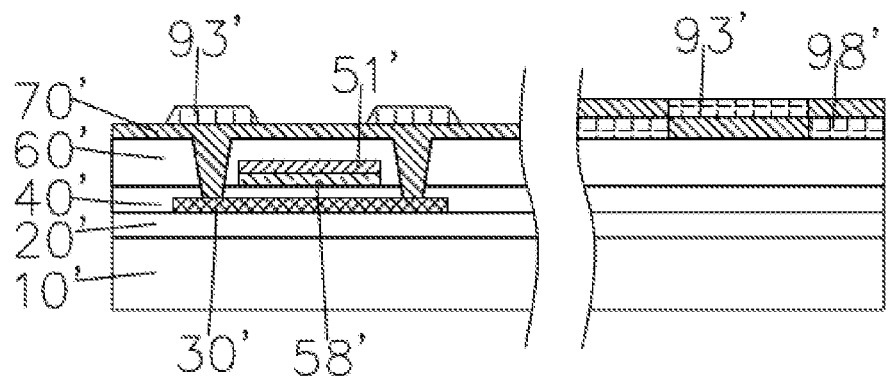
FIG. 15 to FIG. 17 are schematic views showing Step S7' in a method for manufacturing a TFT substrate according to a second embodiment of the present invention.
Figure 16:
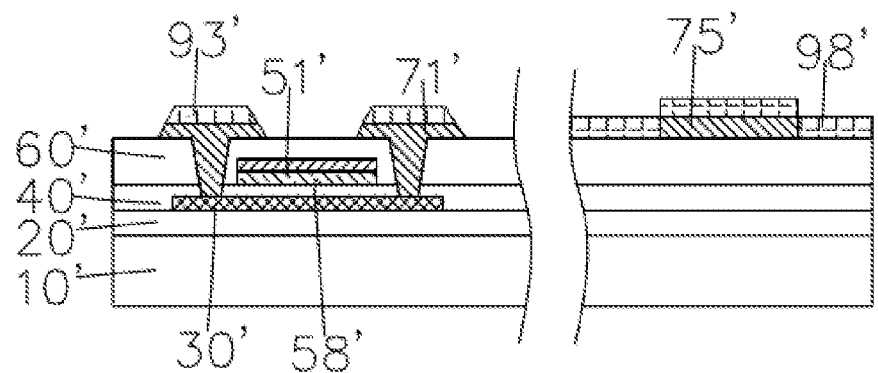
Figure 17:
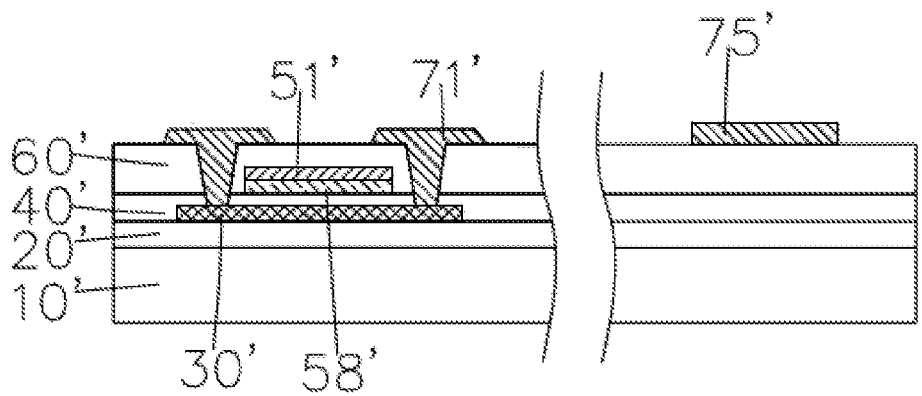

In Step S7', as shown in FIG. 15 to FIG. 17, a source/drain metal layer 70' is formed on the interlayer dielectric layer 60' and the photoresist protective layer 98', a third photoresist layer 93' is formed on the source/drain metal layer 70', dry etching is performed on the source/drain metal layer 70' by using the third photoresist layer 93' as a mask layer to acquire a second metal pattern including a source and a drain 71' and an alignment mark 75', and the third photoresist layer 93' and the photoresist protective layer 98' are removed. The source and the drain 71' are connected to the active layer 30' through the via holes.

Specifically, in Step S7', the surface of the interlayer dielectric layer 60' in the mark peripheral area is protected by the photoresist protective layer 98' from being damaged during dry etching on the source/drain metal layer 70'.

In the method for manufacturing a TFT substrate according to the second embodiment of the present invention, compared with the prior art technology, by adding a transparent conductive protective layer 58' below the gate metal layer 50', the surface of the gate insulating layer 40' can be effectively protected from being damaged during dry etching on the gate metal layer 50'. After dry etching on the gate metal layer 50' is completed, the transparent conductive protective layer 58' on the gate insulating layer 40' is removed by wet etching. Since wet etching exhibits better etching selectivity, the gate insulating layer 40' is not damaged during the removal of the transparent conductive protective layer 58'. The second photoresist layer 92' for forming via holes is formed on the interlayer dielectric layer 60' by using a half-tone mask (HTM), such that the thickness of the second photoresist layer 92' corresponding to the first photoresist portion in the mark peripheral area is larger than the thickness of the remaining second photoresist portion. After the via holes are formed, only the second photoresist portion of the second photoresist layer 92' is removed. The remaining first photoresist portion is used as the photoresist protective layer 98', so that the alignment mark 75' is formed corresponding to the mark area and the surface of interlayer dielectric layer 60' in the mark peripheral area can be protected by the photoresist protective layer 98' during dry etching on the source/drain metal layer 70'.

In the method for manufacturing a TFT substrate according to a third embodiment of the present invention, compared with the first embodiment described above, the protective layer includes a first photoresist protective layer that protects a surface of the gate insulating layer and a second photoresist protective layer that protects a surface of the interlayer dielectric layer. The method specifically includes the following steps:

In Step S10, provided is a base substrate 100, whereon is formed a buffer layer 200, whereon is deposited and patterned an active layer 300.

Figure 18:
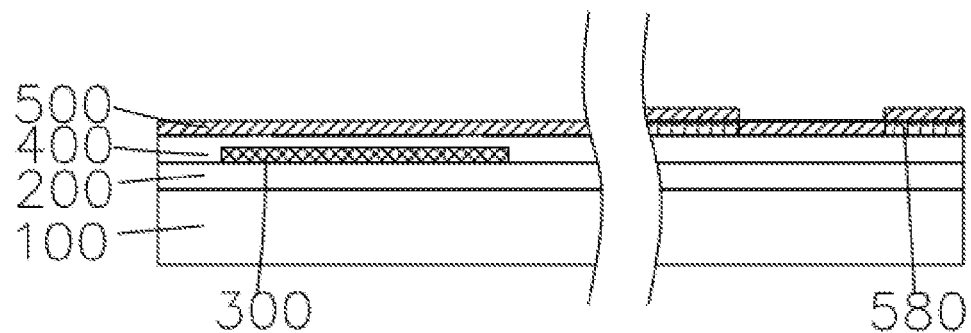
FIG. 18 is a schematic view showing Step S20 in a method for manufacturing a TFT substrate according to a third embodiment of the present invention.

In Step S20, as shown in FIG. 18, a gate insulating layer 400 is formed on the buffer layer 200 and the active layer 300, a first photoresist protective layer 580 corresponding to the mark peripheral area is formed on the gate insulating layer 400, and a gate metal layer 500 is formed on the gate insulating layer 400 and the first photoresist protective layer 580.

Specifically, in Step S20, the first photoresist protective layer 580 exposes the gate insulating layer 400 corresponding to the mark area to subsequently form an alignment mark 550 of the gate metal layer 500.

Figure 19:
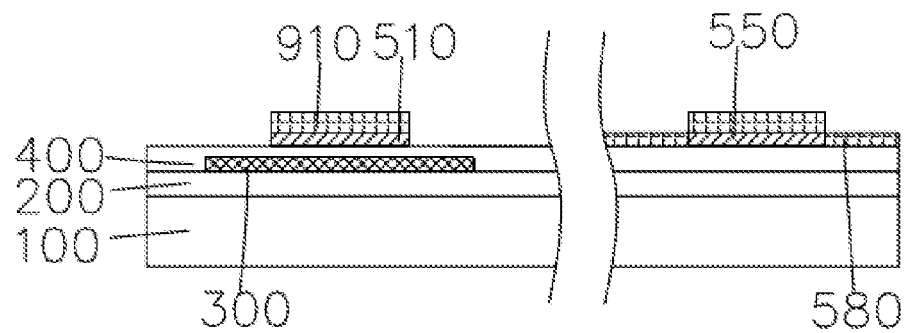
FIG. 19 is a schematic view showing Step S30 in a method for manufacturing a TFT substrate according to a third embodiment of the present invention.

In Step S30, as shown in FIG. 19, a first photoresist layer 910 is formed on the gate metal layer 500, and dry etching is performed on the gate metal layer 500 by using the first photoresist layer 910 as a mask layer to acquire a first metal pattern including a gate 510 and the alignment mark 550.

In Step S40, the first photoresist layer 910 and the first photoresist protective layer 580 are removed.

Figure 20:
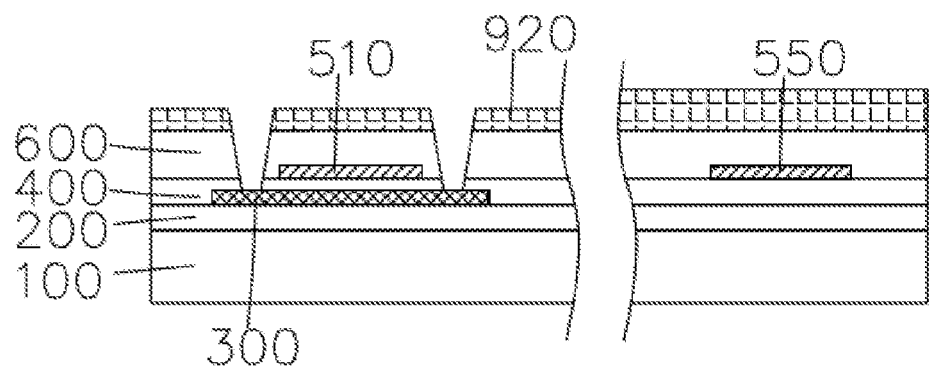
FIG. 20 is a schematic view showing Step S50 in a method for manufacturing a TFT substrate according to a third embodiment of the present invention.

In Step S50, as shown in FIG. 20, an interlayer dielectric layer 600 is deposited on the first metal pattern and the gate insulating layer 400, and a second photoresist layer 920 is formed on the interlayer dielectric layer 600 by using a half-tone mask. The second photoresist layer 920 includes a first photoresist portion corresponding to the mark area and the mark peripheral area and a remaining second photoresist portion. The first photoresist portion has a thickness larger than a thickness of the second photoresist portion, such that the second photoresist layer 920 is used as a mask layer. Via holes corresponding to an upper end of the active layer 300 are defined in the interlayer dielectric layer 600 and the gate insulating layer 400.

Figure 21:
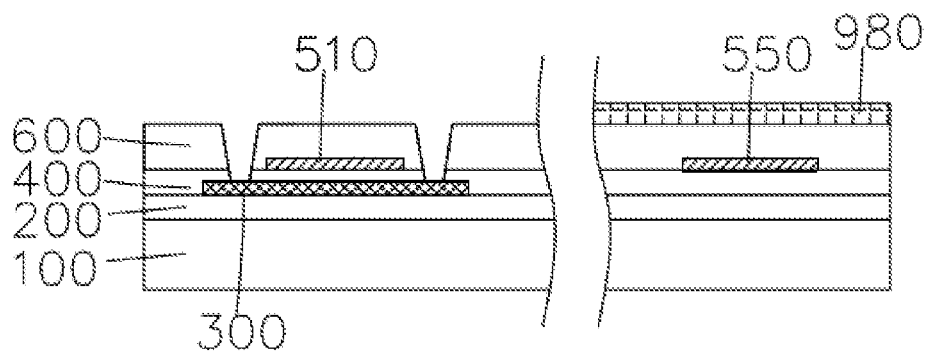
FIG. 21 is a schematic view showing Step S60 in a method for manufacturing a TFT substrate according to a third embodiment of the present invention.

In Step S60, as shown in FIG. 21, an ashing treatment is performed on the second photoresist layer 920 to reduce the thickness of the second photoresist layer 920 until the second photoresist portion is removed, and a photoresist protective layer 980 is formed by using the remaining first photoresist portion.

Figure 22:
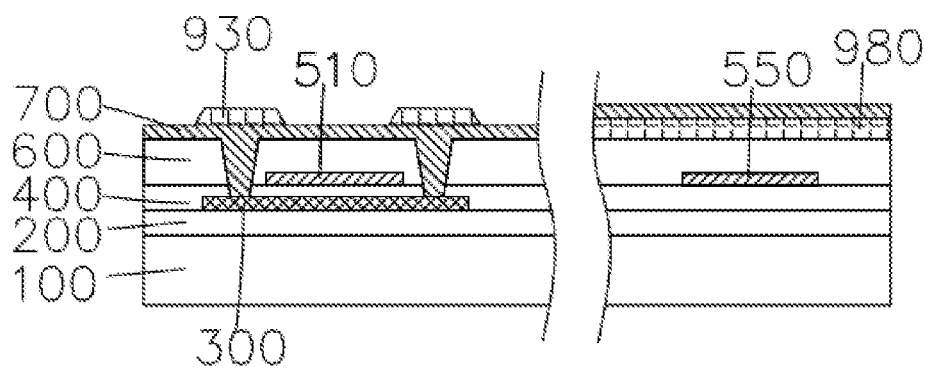
FIG. 22 to FIG. 24 are schematic views showing Step S70 in a method for manufacturing a TFT substrate according to a third embodiment of the present invention.
Figure 23:
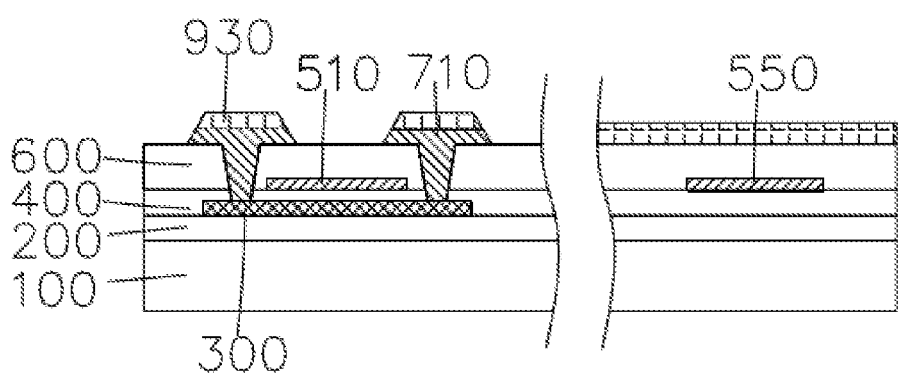
Figure 24:
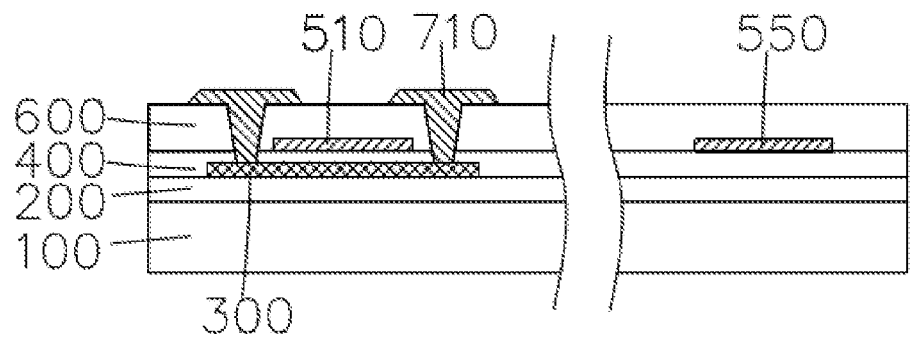

In Step S70, as shown in FIG. 22 to FIG. 24, a source/drain metal layer 700 is formed on the interlayer dielectric layer 600 and the photoresist protective layer 980, a third photoresist layer 930 is formed on the source/drain metal layer 700, dry etching is performed on the source/drain metal layer 700 by using the third photoresist layer 930 as a mask layer to acquire a second metal pattern including a source and a drain 710, and the third photoresist layer 930 and the photoresist protective layer 980 are removed. The source and the drain 710 are connected to the active layer 300 through the via holes.

In the method for manufacturing a TFT substrate according to the third embodiment of the present invention, compared with the prior art technology, by adding a first photoresist protective layer 580 corresponding to the mark peripheral area below the gate metal layer 500 to expose the gate insulating layer 400 corresponding to the mark area, the alignment mark 550 can be formed in the mark area and the surface of the gate insulating layer 400 in the mark peripheral area can be protected by the first photoresist protective layer 580. The second photoresist layer 920 for forming via holes is formed on the interlayer dielectric layer 600 by using a half-tone mask (HTM), such that the thickness of the second photoresist layer 920 corresponding to the first photoresist portion in the mark area and the mark peripheral area is larger than the thickness of the remaining second photoresist portion. After the via holes are formed, only the second photoresist portion of the second photoresist layer 920 is removed. The remaining first photoresist portion is used as the photoresist protective layer 980, so that the surface of interlayer dielectric layer 600 in the mark area and the mark peripheral area can be protected during dry etching on the source/drain metal layer 700.

In the method for manufacturing a TFT substrate according to a fourth embodiment of the present invention, compared with the third embodiment described above, the alignment mark is disposed on the source/drain metal layer. The embodiment specifically includes the following steps:

In Step S10', provided is a base substrate 100', whereon is formed a buffer layer 200', whereon is deposited and patterned an active layer 300'.

Figure 25:
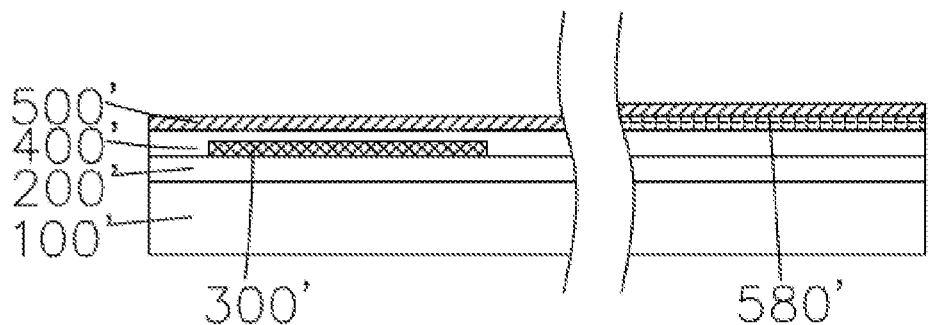
FIG. 25 is a schematic view showing Step S20' in a method for manufacturing a TFT substrate according to a fourth embodiment of the present invention.

In Step S20', as shown in FIG. 25, a gate insulating layer 400' is formed on the buffer layer 200' and the active layer 300', a first photoresist protective layer 580' corresponding to the mark area and the mark peripheral area is formed on the gate insulating layer 400', and a gate metal layer 500' is formed on the gate insulating layer 400' and the first photoresist protective layer 580'.

Figure 26:
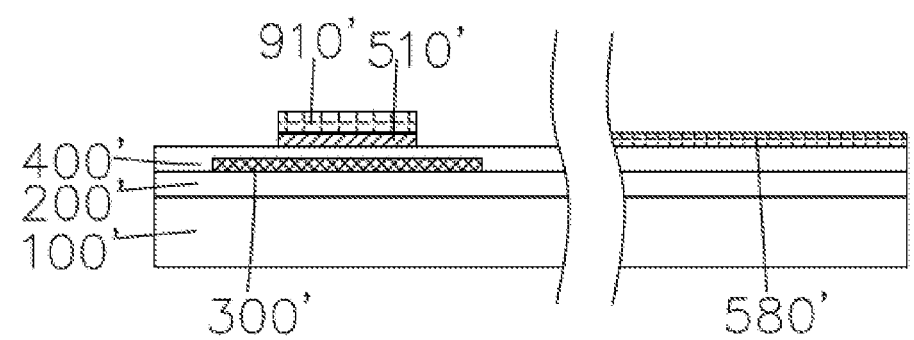
FIG. 26 is a schematic view showing Step S30' in a method for manufacturing a TFT substrate according to a fourth embodiment of the present invention.

In Step S30', as shown in FIG. 26, a first photoresist layer 910' is formed on the gate metal layer 500', and dry etching is performed on the gate metal layer 500' by using the first photoresist layer 910' as a mask layer to acquire a first metal pattern including a gate 510'.

Specifically, in Step S30', the surface of the gate insulating layer 400' in the mark area and the mark peripheral area can be protected by the first photoresist protective layer 580' during dry etching on the gate metal layer 500'.

In Step S40', the first photoresist layer 910' and the first photoresist protective layer 580' are removed.

Figure 27:
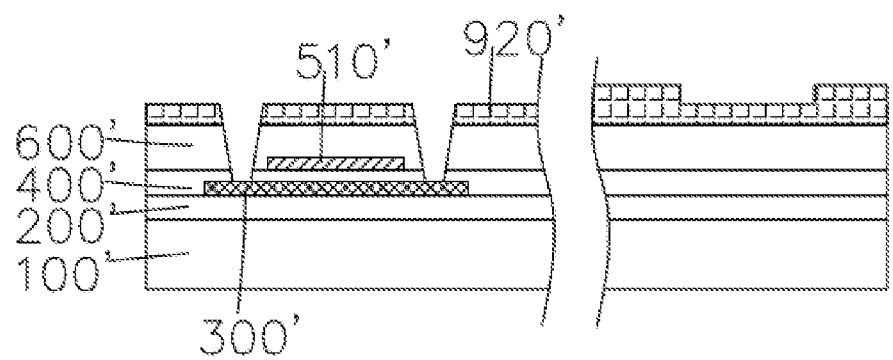
FIG. 27 is a schematic view showing Step S50' in a method for manufacturing a TFT substrate according to a fourth embodiment of the present invention.

In Step S50', as shown in FIG. 27, an interlayer dielectric layer 600' is deposited on the first metal pattern and the gate insulating layer 400', and a second photoresist layer 920' is formed on the interlayer dielectric layer 600' by using a half-tone mask. The second photoresist layer 920' includes a first photoresist portion corresponding to the mark peripheral area and a remaining second photoresist portion. The first photoresist portion has a thickness larger than a thickness of the second photoresist portion, such that the second photoresist layer 920' is used as a mask layer. Via holes corresponding to an upper end of the active layer 300' are defined in the interlayer dielectric layer 600' and the gate insulating layer 400'.

Figure 28:
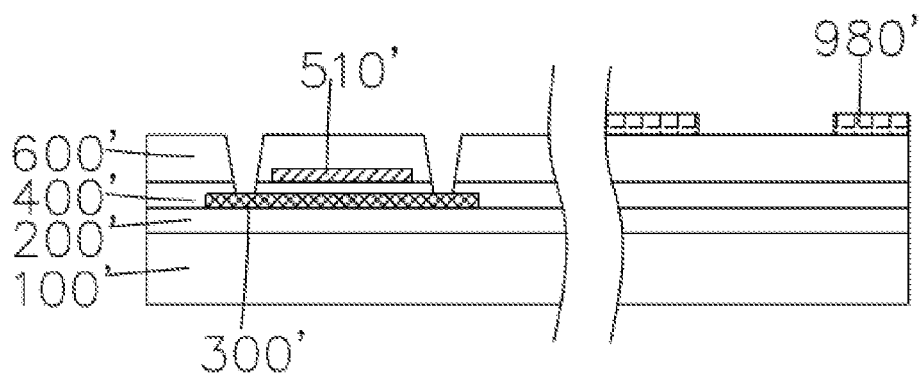
FIG. 28 is a schematic view showing Step S60' in a method for manufacturing a TFT substrate according to a fourth embodiment of the present invention.

In Step S60', as shown in FIG. 28, an ashing treatment is performed on the second photoresist layer 920' to reduce the thickness of the second photoresist layer 920' until the second photoresist portion is removed, and a photoresist protective layer 980' is formed by using the remaining first photoresist portion. Meanwhile, the second photoresist protective layer 980' exposes the gate insulating layer 400' corresponding to the mark area to subsequently form the alignment mark of a source/drain metal layer.

Figure 29:
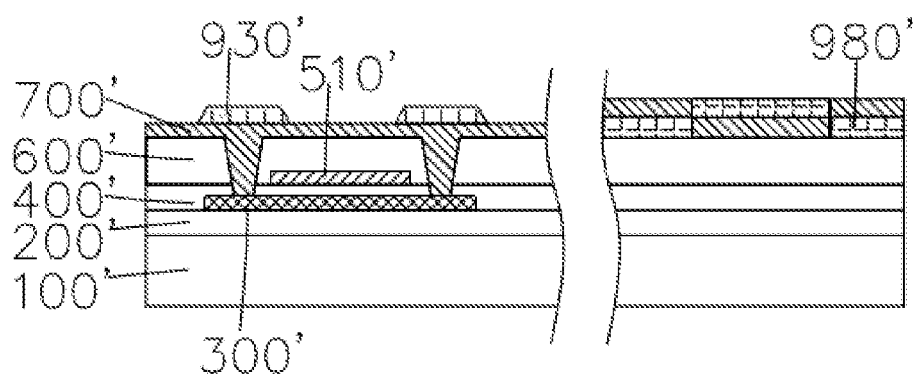
FIG. 29 to FIG. 31 are schematic views showing Step S70' in a method for manufacturing a TFT substrate according to a fourth embodiment of the present invention.
Figure 30:
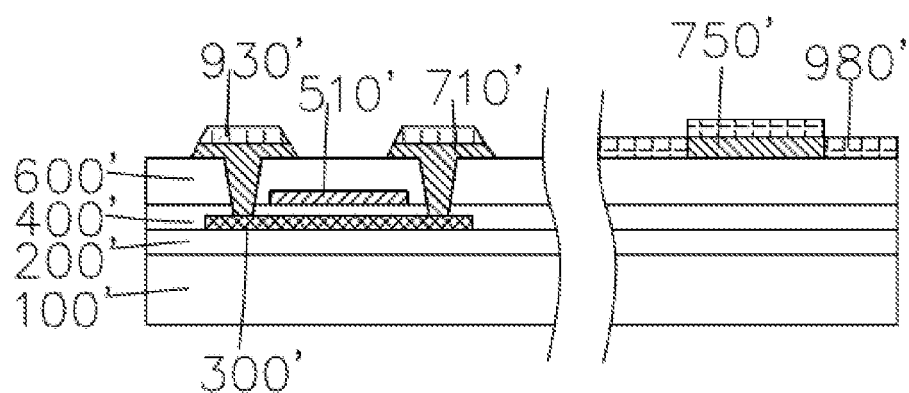
Figure 31:
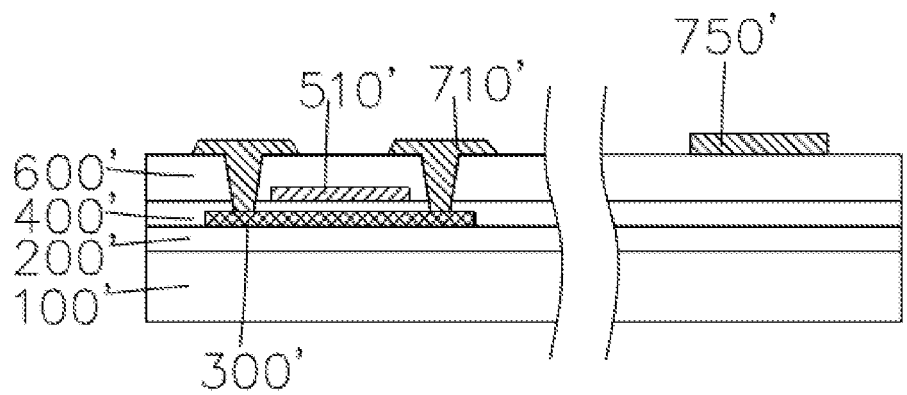

In Step S70', as shown in FIG. 29 to FIG. 31, a source/drain metal layer 700' is formed on the interlayer dielectric layer 600' and the photoresist protective layer 980', a third photoresist layer 930' is formed on the source/drain metal layer 700', dry etching is performed on the source/drain metal layer 700' by using the third photoresist layer 930' as a mask layer to acquire a second metal pattern including a source and a drain 710' and an alignment mark 750', and the third photoresist layer 930' and the photoresist protective layer 980' are removed. The source and the drain 710' are connected to the active layer 300' through the via holes.

In the method for manufacturing a TFT substrate according to the fourth embodiment of the present invention, compared with the prior art technology, by adding a first photoresist protective layer 580' corresponding to the mark area and the mark peripheral area below the gate metal layer 500', the surface of the gate insulating layer 400' in the mark area and the mark peripheral area can be protected during dry etching on the gate metal layer 500'. The second photoresist layer 920' for forming via holes is formed in the interlayer dielectric layer 600' by using a half-tone mask (HTM), such that the thickness of the second photoresist layer 920' corresponding to the first photoresist portion in the mark peripheral area is larger than the thickness of the remaining second photoresist portion. After the via holes are formed, only the second photoresist portion of the second photoresist layer 920' is removed. The remaining first photoresist portion is used as the photoresist protective layer 980', so that the alignment mark 750' can be formed in the mark area and the surface of interlayer dielectric layer 600' in the mark peripheral area can be protected by the second photoresist protective layer 980' during performing dry etching on the source/drain metal layer 700'.

Specifically, the TFT substrate manufactured by the method for manufacturing a TFT substrate according to the present invention can be used to fabricate an OLED panel by sequentially forming a planarization layer, an OLED layer, and a thin-film encapsulation layer thereon.

Based on the above-mentioned method for manufacturing a TFT substrate, referring to FIG. 10, the present invention further provides a TFT substrate. As shown in FIG. 10, a TFT substrate according to a fifth embodiment of the present invention includes a base substrate 10, a buffer layer 20 disposed on the base substrate 10, an active layer 30 disposed on the buffer layer 20, a gate insulating layer 40 disposed on the buffer layer 20 and the active layer 30, a conductive protective layer 58 disposed on the gate insulating layer 40, a gate metal layer 50 disposed on the conductive protective layer 58, an interlayer dielectric layer 60 disposed on the gate insulating layer 40, and a source/drain metal layer 70 disposed on the interlayer dielectric layer 60.

Specifically, the active layer 30 may be a low temperature polysilicon (LTPS) active layer.

Specifically, the material of the transparent conductive protective layer 58 is indium-tin oxide (ITO).

Specifically, the interlayer dielectric layer 60 and the gate insulating layer 40 are provided thereon with via holes correspondingly corresponding to an upper end of the active layer 30.

Specifically, the gate metal layer 50 includes a first metal pattern including a gate 51 and an alignment mark 55.

Specifically, the transparent conductive protective layer 58 is correspondingly disposed below the first metal pattern and is provided with a transparent conductive pattern having the same pattern as the first metal pattern.

Specifically, the source/drain metal layer 70 is provided with a second metal pattern including a source and a drain 71, and the source and the drain 71 are connected to the active layer 30 through the via holes.

Compared with the prior art, the TFT substrate according to a fifth embodiment of the present invention is provided with a transparent conductive protective layer 58 added below the gate metal layer 50 to effectively protect the surface of the gate insulating layer 40 in the mark area from being damaged during performing dry etching on the gate metal layer 50 to avoid subsequent alignment anomalies.

In summary, the method for manufacturing a TFT substrate according to the present invention uses an upper light source and a lower light source, and provides both EPI illumination and transmissive illumination, thereby effectively improving the recognition rate of the alignment mark by the alignment CCD camera and exhibiting higher alignment detection accuracy. In the alignment detection method for liquid-crystal display panels according to the present invention, when the alignment mark overlaps with the rim of the transparent fixed plate, the combination of EPI illumination and transmissive illumination can effectively improve the recognition rate of the alignment mark by the alignment CCD camera to further improves the accuracy of alignment detection. In the TFT substrate of the present invention, a transparent conductive protective layer is disposed between the metal layer and the inorganic insulating layer, and the transparent conductive protective layer is correspondingly disposed below the metal layer corresponding thereto and has a transparent conductive pattern having the same pattern as the metal layer. The transparent conductive protective layer may be used to protect the surface of the inorganic insulating layer in the mark area and the mark peripheral area during performing dry etching on the metal layer to form the metal pattern, so as to reduce the surface damage of the inorganic insulating layer during performing dry etching on the metal layer to avoid subsequent alignment anomalies.

In the above, for those with ordinary skill in the art, various other changes and modifications can be made according to the technical solutions and technical concept of the present invention, and all such changes and modifications are within the scope of the claims of the present invention.

What is claimed is:

1. A method for manufacturing a thin-film transistor (TFT) substrate, wherein the TFT substrate is divided into a display area and a display peripheral area surrounding the display area, the display peripheral area being divided into a mark area and a mark peripheral area surrounding the mark area, the method comprising steps of:
   forming an inorganic insulating layer;
   forming a protective layer on the inorganic insulating layer;
   forming a metal layer on the inorganic insulating layer and the protective layer;
   performing dry etching on the metal layer to acquire a metal pattern; and
   removing the protective layer uncovered by the metal pattern;
   wherein the protective layer is provided to protect a surface of the inorganic insulating layer in the mark area and the mark peripheral area during performing dry etching on the metal layer.

2. The method for manufacturing a TFT substrate of claim 1, wherein the protective layer comprises a transparent conductive protective layer and, in Step of removing the protective layer uncovered by the metal pattern, a transparent conductive pattern having the same pattern as the metal pattern is formed by a remaining portion of the transparent conductive protective layer.

3. The method for manufacturing a TFT substrate of claim 1, wherein the protective layer comprises a photoresist protective layer and, prior to the step of forming the metal layer, the photoresist protective layer is formed outside a region where the metal pattern to be formed and, in Step of removing the protective layer uncovered by the metal pattern, the photoresist protective layer is completely removed.

4. The method for manufacturing a TFT substrate of claim 1, wherein the TFT substrate comprises a plurality of inorganic insulating layers and a plurality of metal layers, the plurality of inorganic insulating layers comprises a gate insulating layer and an interlayer dielectric layer, and the plurality of metal layers comprises a gate metal layer and a source/drain metal layer, wherein the metal pattern formed by the gate metal layer comprises a gate disposed in the display area and an alignment mark disposed in the mark area, and the protective layer comprises a transparent conductive protective layer that protects a surface of the gate insulating layer and a photoresist protective layer that protects a surface of the interlayer dielectric layer, the method specifically comprising steps of:
   Step S1, providing a base substrate, whereon is formed a buffer layer, whereon is deposited and patterned an active layer;
   Step S2, sequentially forming the gate insulating layer, the transparent conductive protective layer and the gate metal layer on the buffer layer and the active layer;
   Step S3, forming a first photoresist layer on the gate metal layer, performing dry etching on the gate metal layer by using the first photoresist layer as a mask layer to acquire a first metal pattern comprising the gate and the alignment mark;
   Step S4, performing wet etching on the transparent conductive protective layer by using the first photoresist layer and the first metal pattern as a mask layer to remove the transparent conductive protective layer uncovered by the first metal pattern, forming a transparent conductive pattern having the same pattern as the first metal pattern, and removing the first photoresist layer;
   Step S5, depositing the interlayer dielectric layer on the first metal pattern and the gate insulating layer, and forming a second photoresist layer on the interlayer dielectric layer by using a half-tone mask, wherein the second photoresist layer comprises a first photoresist portion corresponding to the mark area and the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;
   Step S6, performing an ashing treatment on the second photoresist layer to reduce the thickness of the second photoresist layer until the second photoresist portion is removed, and forming the photoresist protective layer by using the remaining first photoresist portion; and
   Step S7, forming the source/drain metal layer on the interlayer dielectric layer and the photoresist protective layer, forming a third photoresist layer on the source/drain metal layer, performing dry etching on the source/drain metal layer by using the third photoresist layer as a mask layer to acquire a second metal pattern comprising a source and a drain, and removing the third photoresist layer and the photoresist protective layer, wherein the source and the drain are connected to the active layer through the via holes.

5. The method for manufacturing a TFT substrate of claim 1, wherein the TFT substrate comprises a plurality of inorganic insulating layers and a plurality of metal layers, the plurality of inorganic insulating layers comprises a gate insulating layer and an interlayer dielectric layer, and the plurality of metal layers comprises a gate metal layer and a source/drain metal layer, wherein the metal pattern formed by the source/drain metal layer comprises a source and a drain disposed in the display area and an alignment mark disposed in the mark area, and the protective layer comprises a transparent conductive protective layer that protects a surface of the gate insulating layer and a photoresist protective layer that protects a surface of the interlayer dielectric layer, the method specifically comprising steps of:

Step S1', providing a base substrate, whereon is formed a buffer layer, whereon is deposited and patterned an active layer;

Step S2', sequentially forming the gate insulating layer, the transparent conductive protective layer and the gate metal layer on the buffer layer and the active layer;

Step S3', forming a first photoresist layer on the gate metal layer, performing dry etching on the gate metal layer by using the first photoresist layer as a mask layer to acquire a first metal pattern comprising the gate;

Step S4', performing wet etching on the transparent conductive protective layer by using the first photoresist layer and the first metal pattern as a mask layer to remove the transparent conductive protective layer uncovered by the first metal pattern, forming a transparent conductive pattern having the same pattern as the first metal pattern, and removing the first photoresist layer;

Step S5', depositing the interlayer dielectric layer on the first metal pattern and the gate insulating layer, and forming a second photoresist layer on the interlayer dielectric layer by using a half-tone mask, wherein the second photoresist layer comprises a first photoresist portion corresponding to the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S6', performing an ashing treatment on the second photoresist layer to reduce the thickness of the second photoresist layer until the second photoresist portion is removed, and forming the photoresist protective layer by using the remaining first photoresist portion; and Step S7', forming the source/drain metal layer on the interlayer dielectric layer and the photoresist protective layer, forming a third photoresist layer on the source/drain metal layer, performing dry etching on the source/drain metal layer by using the third photoresist layer as a mask layer to acquire a second metal pattern comprising the source and the drain and the alignment mark, and removing the third photoresist layer and the photoresist protective layer, wherein the source and the drain are connected to the active layer through the via holes.

6. The method for manufacturing a TFT substrate of claim 1, wherein the TFT substrate comprises a plurality of inorganic insulating layers and a plurality of metal layers, the plurality of inorganic insulating layers comprises a gate insulating layer and an interlayer dielectric layer, and the plurality of metal layers comprises a gate metal layer and a source/drain metal layer, wherein the metal pattern formed by the gate metal layer comprises a gate disposed in the display area and an alignment mark disposed in the mark area, and the protective layer comprises a first photoresist protective layer that protects a surface of the gate insulating layer and a second photoresist protective layer that protects a surface of the interlayer dielectric layer, the method specifically comprising steps of:

Step S10, providing a base substrate, whereon is formed a buffer layer, whereon is deposited and patterned an active layer;

Step S20, depositing the gate insulating layer on the buffer layer and the active layer, forming on the gate insulating layer the first photoresist protective layer corresponding to the mark peripheral area, and forming the gate metal layer on the gate insulating layer and the first photoresist protective layer;

Step S30, forming a first photoresist layer on the gate metal layer, performing dry etching on the gate metal layer by using the first photoresist layer as a mask layer, to acquire a first metal pattern comprising the gate and the alignment mark;

Step S40, removing the first photoresist layer and the first photoresist protective layer;

Step S50, depositing the interlayer dielectric layer on the first metal pattern and the gate insulating layer, and forming a second photoresist layer on the interlayer dielectric layer by using a half-tone mask, wherein the second photoresist layer comprises a first photoresist portion corresponding to the mark area and the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S60, performing an ashing treatment on the second photoresist layer to reduce the thickness of the second photoresist layer until the second photoresist portion is removed, and forming the second photoresist protective layer by using the remaining first photoresist portion; and Step S70, forming the source/drain metal layer on the interlayer dielectric layer and the second photoresist protective layer, forming a third photoresist layer on the source/drain metal layer, performing dry etching on the source/drain metal layer by using the third photoresist layer as a mask layer to acquire a second metal pattern comprising a source and a drain, and removing the third photoresist layer and the second photoresist protective layer, wherein the source and the drain are connected to the active layer through the via holes.

7. The method for manufacturing a TFT substrate of claim 1, wherein the TFT substrate comprises a plurality of inorganic insulating layers and a plurality of metal layers, the plurality of inorganic insulating layers comprises a gate insulating layer and an interlayer dielectric layer, and the plurality of metal layers comprises a gate metal layer and a source/drain metal layer, wherein the metal pattern formed by the source/drain metal layer comprises a source and a drain disposed in the display area and an alignment mark disposed in the mark area, and the protective layer comprises a first photoresist protective layer that protects a surface of the gate insulating layer and a second photoresist protective layer that protects a surface of the interlayer dielectric layer, the method specifically comprising steps of:

Step S10', providing a base substrate, whereon is formed a buffer layer, whereon is deposited and patterned an active layer;

Step S20', depositing the gate insulating layer on the buffer layer and the active layer, forming on the gate insulating layer the first photoresist protective layer corresponding to the mark peripheral area, and forming the gate metal layer on the gate insulating layer and the first photoresist protective layer;

Step S30', forming a first photoresist layer on the gate metal layer, performing dry etching on the gate metal layer by using the first photoresist layer as a mask layer, to acquire a first metal pattern comprising the gate and the alignment mark;

Step S40', removing the first photoresist layer and the first photoresist protective layer;

Step S50', depositing the interlayer dielectric layer on the first metal pattern and the gate insulating layer, and forming a second photoresist layer on the interlayer dielectric layer by using a half-tone mask, wherein the second photoresist layer comprises a first photoresist portion corresponding to the mark peripheral area and a remaining second photoresist portion, the first photoresist portion has a thickness larger than a thickness of the second photoresist portion, the second photoresist layer is a mask layer, and via holes corresponding to an upper end of the active layer are defined in the interlayer dielectric layer and the gate insulating layer;

Step S60', performing an ashing treatment on the second photoresist layer to reduce the thickness of the second photoresist layer until the second photoresist portion is removed, and forming the second photoresist protective layer by using the remaining first photoresist portion; and Step S70', forming the source/drain metal layer on the interlayer dielectric layer and the second photoresist protective layer, forming a third photoresist layer on the source/drain metal layer, performing dry etching on the source/drain metal layer by using the third photoresist layer as a mask layer to acquire a second metal pattern comprising the source and the drain and the alignment mark, and removing the third photoresist layer and the second photoresist protective layer, wherein the source and the drain are connected to the active layer through the via holes.

8. A thin-film transistor (TFT) substrate, which is divided into a display area and a display peripheral area surrounding the display area, the display peripheral area being divided into a mark area and a mark peripheral area surrounding the mark area, the TFT substrate comprising an inorganic insulating layer, a metal layer and a transparent conductive protective layer correspondingly disposed between the inorganic insulating layer and the metal layer;

wherein the metal layer comprises a metal pattern, the transparent conductive protective layer is correspondingly disposed below the metal layer corresponding thereto and comprises a transparent conductive pattern having the same pattern as the metal layer, and the transparent conductive protective layer is provided to protect a surface of the inorganic insulating layer in the mark area and the mark peripheral area during performing dry etching on the metal layer to form the metal pattern.

9. The TFT substrate of claim 8, comprising a plurality of inorganic insulating layers and a plurality of metal layers, wherein the plurality of inorganic insulating layers comprises a gate insulating layer and an interlayer dielectric layer, the plurality of metal layers comprises a gate metal layer disposed on the gate insulating layer and a source/drain metal layer disposed on the interlayer dielectric layer, and the transparent conductive protective layer is correspondingly disposed between the gate insulating layer and gate metal layer, wherein, the TFT substrate specifically comprises a base substrate, a buffer layer disposed on the base substrate, an active layer disposed on the buffer layer, a gate insulating layer disposed on the buffer layer and the active layer, a transparent conductive protective layer disposed on the gate insulating layer, a gate metal layer disposed on the transparent conductive protective layer, an interlayer dielectric layer disposed on the gate metal layer and gate insulating layer, and a source/drain metal layer disposed on the interlayer dielectric layer;

the gate metal layer comprises a first metal pattern comprising a gate;

the transparent conductive protective layer is correspondingly disposed below the gate metal layer and comprises a transparent conductive pattern having the same pattern as the first metal layer; and the source/drain metal layer comprises a second metal pattern comprising a source and a drain.

10. The TFT substrate of claim 8, wherein one of the first metal pattern and the second metal pattern further comprises an alignment mark correspondingly disposed in the mark area.

* * * * *